United States Patent [19]

Todokoro et al.

[11] Patent Number: 4,574,206
[45] Date of Patent: Mar. 4, 1986

[54] WAVE-SHAPING CIRCUIT

[75] Inventors: Shigeru Todokoro, Fujisawa; Tadashi Kojima, Yokosuka, both of Japan

[73] Assignee: Tokyo Shibaura Denki Kabushiki Kaisha, Kawasaki, Japan

[21] Appl. No.: 300,604

[22] Filed: Sep. 9, 1981

[30] Foreign Application Priority Data

Sep. 16, 1980 [JP] Japan .................. 55-128334

[51] Int. Cl.$^4$ ................. H03K 5/08; H03K 5/135
[52] U.S. Cl. .................. 307/359; 307/360; 307/547; 307/268; 307/608; 328/147; 328/164
[58] Field of Search ............. 307/547, 353, 354, 358, 307/359, 360, 473, 480, 603, 608, 268, 265; 328/151, 146, 147, 149, 164

[56] References Cited

U.S. PATENT DOCUMENTS

| 3,225,213 | 12/1965 | Hinrichs et al. | 307/353 |
| 3,491,304 | 1/1970 | Justus et al. | 307/352 |
| 3,543,170 | 11/1970 | Diederich | 328/164 |
| 3,701,954 | 10/1972 | Seminatore et al. | 307/359 |
| 3,996,479 | 12/1976 | Schmitz | 328/147 |
| 4,406,988 | 4/1983 | Scholz | 307/351 |

FOREIGN PATENT DOCUMENTS 131324 6/1978 German Democratic Rep. .

OTHER PUBLICATIONS

"Upper and Lower Thresholds Can Be Set Independently In Latching-Comparator Circuit", R. S. Viles; ELECTRONIC DESIGN, vol. 26, Dec. 20, 1977 p. 176.

Primary Examiner—John S. Heyman
Attorney, Agent, or Firm—Finnegan, Henderson Farabow, Garrett & Dunner

[57] ABSTRACT

A wave-shaping circuit which comprises a comparator for comparing the level of a signal reproduced from a magnetic tape on which, for example, PCM signals are recorded with the level of a reference signal, and a D flip-flop circuit for holding an output signal from the comparator for a prescribed period. Where the reproduced signal has a higher level than the original level of the reference signal, then the reference signal is made to have a higher level than the original level by an output signal from the D flip-flop circuit, that is, an output signal from the comparator. Where the reproduced signal has a lower level than the original level of a reference signal, then the reference signal is made to have a lower level than the original level by the output signal from the comparator. As a result, strains occurring at the high density recording are not reproduced.

6 Claims, 11 Drawing Figures

FIG. 1
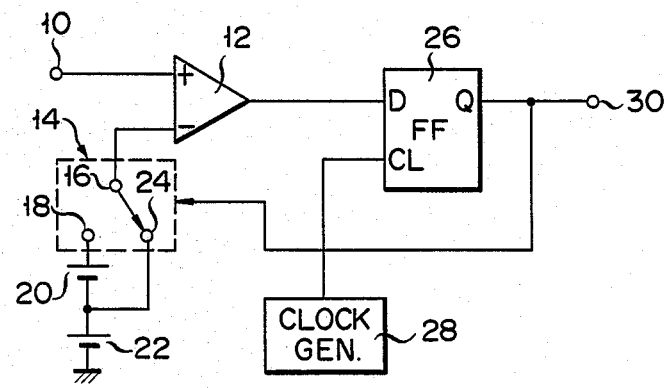

FIG. 2C
FIG. 2E
T1 T2 T3  T4 T5 T6
FIG. 3A 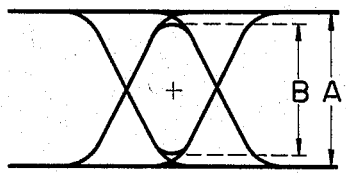   FIG. 3B 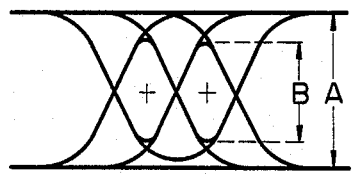

WAVE-SHAPING CIRCUIT

BACKGROUND OF THE INVENTION

This invention relates to a wave-shaping circuit applied in processing a digital signal.

Recently, progress has been made in the technique of processing digital signals. Analog signals such as audio signals are recorded after being converted into digital signals such as PCM signals. Also in the field of signal transmission digital signals are processed. In this connection it will be noted that reproduced or transmitted digital signals cease to have a perfect rectangular waveform, and instead are deteriorated due to the S/N ratio or frequency characteristic of a recording or transmission system. Therefore, it is necessary to carry out the wave-shaping of digital signals obtained in order to let the digital signals have the same rectangular waveform as the original signals. A wave-shaping circuit generally comprises a comparator for comparing the level of an input signal with a reference value and a holding circuit for reading an output signal from the comparator in response to a clock signal and holding the fetched signal.

Where, however, an input signal includes noises, then it sometimes happens that an output signal from the comparator ceases to denote a code corresponding to that of the original signal and is wave-shaped in the form of a wrong signal. A coding error is a detrimental problem in the processing of a digital signal. Further, the rectangular waveform of a digital signal has an extremely broad frequency spectrum. Consequently, the digital signals should have a broad frequency characteristic to assure proper recording and transmission, and be recorded or transmitted with greater density. However, the S/N ratio and frequency characteristic of the recording and transmission systems generally become less satisfactory in the higher frequency region. Where, therefore, digital signals are recorded or transmitted with higher density, then the percentage occurrence of errors tends to increase.

SUMMARY OF THE INVENTION

It is therefore the object of this invention to provide a wave-shaping circuit which reduces the rate of coding errors in processing digital signals.

To attain the above-mentioned object, this invention provides a wave-shaping circuit which comprises an input terminal for receiving a coded signal, a circuit for generating a reference signal whose level can be varied by a control signal, a comparator for making a comparison between a signal supplied through the input terminal and the reference signal, a holding circuit for holding output signals from the comparator for a prescribed period, and a circuit for branching an output signal from the holding circuit and supplying the branched output signal to a control terminal of the variable level reference signal generating circuit.

BRIEF DESCRIPTION OF THE DRAWINGS

FIG. 1 shows the arrangement of a wave-shaping circuit according to a first embodiment of this invention;

FIGS. 2A to 2E are time charts illustrating the operation of the first embodiment;

FIGS. 3A and 3B are general eye patterns;

DETAILED DESCRIPTION OF THE PREFERRED EMBODIMENTS

Figure 2A:

Description is now given with reference to the accompanying drawing of a wave-shaping circuit according to a first embodiment of this invention. Referring to FIG. 1, an input terminal 10 connected to an output terminal of a reproduction circuit (not shown) is connected to a non-inverting input terminal of a comparator 12. A movable contact 16 of a switching circuit 14 is connected to an inverting input terminal of the comparator 12. A first fixed contact 18 is grounded through series-connected power sources 20 and 22. A second fixed contact 24 is connected to a junction of the power sources 20 and 22. An output terminal of the comparator 12 is connected to an input terminal D of a D flip-flop circuit 26. An output terminal of a clock signal generator 28 is connected to a clock terminal CL of the D flip-flop circuit 26. An output terminal Q of the D flip-flop circuit 26 is connected to an output terminal 30 of a wave-shaping circuit and also to a control terminal of the switching circuit 14. The output terminal 30 is connected to a decoding circuit (not shown).

Description is now given of the operation of the wave-shaping circuit according to the first embodiment of this invention. Where the D flip-flop circuit 26 issues an output signal having a level of logic "1" (abbreviated as an H level), then the switching circuit 14 is thrown to the first fixed contact 18. Where the D flip-flop circuit 26 sends forth an output signal having a level of logic "0" (abbreviated as an L level), then the switching circuit 14 is thrown to the second fixed contact 24. Namely, where the comparator 12 issues an output signal having the H level, that is, a signal supplied to the input terminal 10 has a higher level than a signal sent forth from the movable contact 16 of the switching circuit 14, then the movable contact 16 is impressed with voltages V1+V2 (respectively denoting the voltages of the power sources 20 and 22). Where the comparator 12 issues an output signal having a low level, namely, where a signal supplied to the input terminal 10 has a lower level than a signal issued from the movable contact 16 of the switching circuit 14, then the movable contact 16 is impressed with the voltage V2.

Figure 2B:
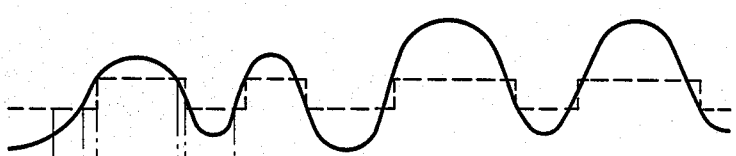
Figure 2D:

When recorded, for example, on a magnetic tape, an audio signal is converted into a PCM signal shown in FIG. 2A. However, a signal actually reproduced from a tape and supplied to the input terminal 10 has a rounded wave shape indicated in a solid line in FIG. 2B. Now let it be assumed that at a point of time T1, the D flip-flop circuit 26 produces the L level output signal shown in FIG. 2C. Then the movable contact 16 of the switching circuit 14 is connected to the second fixed contact 24. The inverting input terminal of the comparator 12 is impressed with the voltage V2 shown in a broken line in FIG. 2B. Where the input signal (a solid line in FIG. 2B) has a lower level than the level of the voltage V2 (a broken line in FIG. 2B), then the comparator 12 issues the L level output signal shown in FIG. 2C. Where, at a point of time T2, the input signal has a higher level than that of the voltage V2, then the comparator 12 generates the H level output signal shown in FIG. 2C. The D flip-flop circuit 26 whose D input terminal is supplied with the H level signal issues the H level output signal shown in FIG. 2E at the rise of the succeeding clock pulse, for example, a pulse issued at a point of time T3. Where the D flip-flop circuit 26 sends forth the H level output signal, then the switching circuit 14 is thrown to the first fixed contact 18. As a result, the inverting input terminal of the comparator 12 is impressed with the voltages V1+V2 shown in a broken line in FIG. 2B. At a point of time T4, therefore, the comparator 12 sends forth the L level output signal shown in FIG. 2C. An output signal from the D flip-flop circuit 26 has its level inverted to the L level as shown in FIG. 2E at the succeeding point of time T5 when the succeeding clock pulse (FIG. 2D) rises. Therefore, the inverting input terminal of the comparator 12 is impressed with the voltage V2 as shown in a broken line in FIG. 2B.

With the wave-shaping circuit according to the first embodiment of this invention, the reference signal has its level varied with the result of comparison between the reference level and that of the input signal, thereby producing the following effect. Namely, where the input signal has a higher level than that of the reference signal, then the level of the reference signal is shifted to a high level. Where the input signal has a lower level than that of the reference signal, then the reference signal has its level shifted to a low level. Therefore, the level of the output signal from the comparator 12 is not readily inverted by noise signals having a variable level and strains. Changes in the level of the reference signal are restricted to a proper extent.

Figure 4:
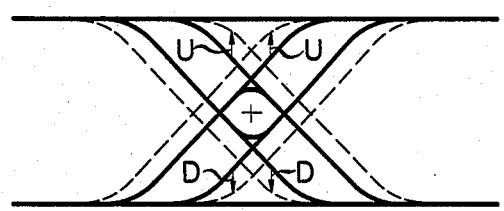
FIG. 4 is an eye pattern occurring in the wave-shaping circuit of the first embodiment.

Description is now given from a different point of view of the fact that the coding error can be reduced by varying the level of the reference signal. The coding error in processing digital signals is closely related to the modulation-demodulation system and circuit arrangement. Since it is extremely difficult to determine the rate of coding error, the aperture coefficient of an eye pattern is generally applied in defining the rate of coding error. The eye pattern is obtained by superposing on the oscilloscope the nonshaped waveforms of reproduced signals appearing during several periods regardless of the data frame by utilizing the residual images with the waveforms synchronized with each other. The eye pattern is illustrated in FIGS. 3A and 3B, in which the abscissa denotes time and the ordinate represents the signal level. FIG. 3A refers to the case where signals were recorded on a tape with a low density, and FIG. 3B refers to the case where signals were recorded on a tape with a high density. The mark + denotes a detection point. A space surrounding this detection point is taken as the aperture coefficient (B/A). The larger the aperture coefficient, the lower the rate of coding error, as is generally judged. The character A denotes a maximum amplitude of a signal, and the character B means a level which can be effectively judged. A timing of the detection point is chosen to be that at which half the respective periods terminates, and a signal level of the detection point is defined to be a reference level used in reading a signal. With the foregoing embodiment, if the input signal has a higher level than the original level of the reference signal, then the reference signal is let to have a higher level than the original level. This arrangement causes a detection point on the eye pattern to be shifted upward. If, therefore, observation is made, as shown in FIG. 4, with the position of the detection point fixed, then the waveform of the eye pattern is shifted downward as indicated by an arrow D. Further, with the foregoing embodiment, if the input signal has a lower level than the original level of the reference signal, then the reference signal is let to have a lower level than the original level. This arrangement causes the detection point on the eye pattern to be shifted downward. If, therefore, observation is made, as shown in FIG. 4, with the position of the detection point fixed, then the waveform of the eye pattern is shifted upward as indicated by an arrow U. As a result, the level B is rendered high, and the aperture coefficient of the eye pattern is enlarged, thereby decreasing the rate of coding error.

Figure 5:
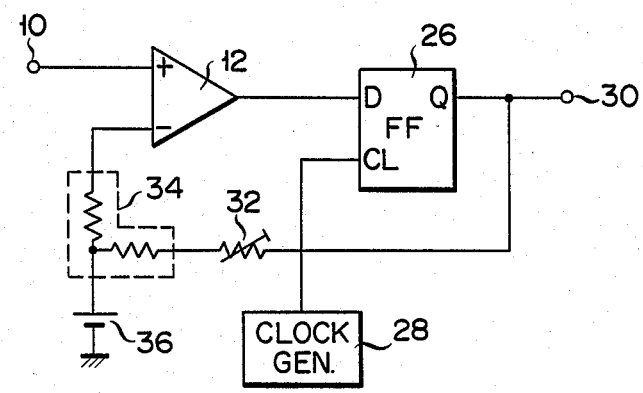
FIG. 5 indicates the arrangement of a wave-shaping circuit according to a second embodiment of the invention.

Description is now given with reference to FIG. 5 of a wave-shaping circuit according to a second embodiment of this invention. The parts of FIG. 5 as those of the first embodiment are denoted by the same numerals, description thereof being emitted.

An output terminal of the D flip-flop circuit 26 is connected to one of the input terminals of a mixer 34 through a variable resistor 32 for level adjustment. A power source 36 is connected to the other input terminal of the mixer 34. An output terminal of the mixer 34 is connected to an inverting input terminal of the comparator 12. With the second embodiment of FIG. 5, the reference level of the comparator 12 is made to vary with a sum of the voltage of the power source 36 and an output voltage from the D flip-flop circuit 26.

Figure 6:
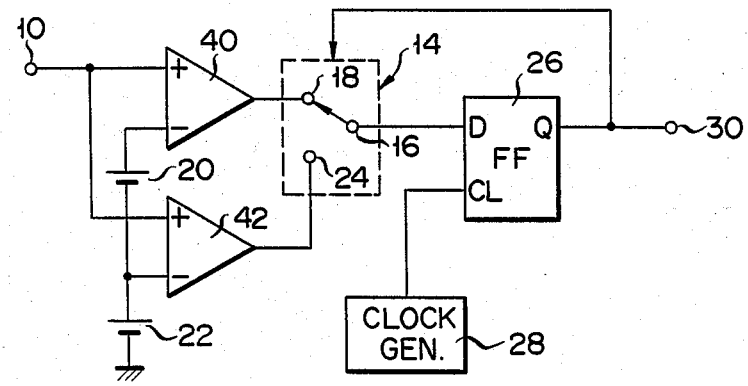
FIG. 6 sets forth the arrangement of a wave-shaping circuit according to a third embodiment of the invention.

Description is now given with reference to FIG. 6 of a wave-shaping circuit according to a third embodiment of this invention. This third embodiment comprises two comparators 40 and 42. The input terminal 10 is connected to the non-inverting input terminals of the comparators 40 and 42. The inverting input terminal of the comparator 40 is grounded through series-connected power sources 20 and 22. The inverting input terminal of the comparator 42 is connected to a junction of the power sources 20 and 22. The output terminals of the comparators 40 and 42 are respectively connected to the first and second fixed contacts 18 and 24 of the switching circuit 14. The movable contact 16 of the switching circuit 14 is connected to the input terminal D of the D flip-flop circuit 26. The changeover of the comparators applied in the third embodiment is equivalent to the variation of the level of the reference signal.

This invention is not limited to the foregoing embodiments. The invention can be practised in various modifications, provided a wave-shaping circuit is the type in which the level of the reference signal to be compared with that of the input signal is varied to allow the result of comparison to be easily inverted.

What we claim is:

1. A wave-shaping circuit which comprises:
    an input terminal for receipt of a coded signal;
    means for generating a reference signal which reference signal varies between low and high levels in response to a control signal;
    means for comparing said coded signal supplied through said input terminal with said reference signal and for producing a first type output signal when said coded input signal is less than said reference signal and for producing a second type output signal when said coded input signal is greater than said reference signal;
    a clock signal generator;

means, connected to said comparing means and said clock signal generator, for holding an output signal from said comparing means for a period of time which is related to the duration of said output signal from said comparing means and in synchronism with a clock signal from said clock signal generator; and means for branching part of an output signal from said holding means and supplying this branched output signal to said reference signal generating means as said control signal such that said reference signal generating means generates said low level reference signal when said holding means holds said first type output signal and generates said high level reference signal when said holding means holds said second type output signal from said comparing means.

2. The wave-shaping circuit according to claim 1, wherein said reference signal generating means comprises a first high level and second low level power source; and a switch which is connected to said first and second power sources and selectively connects one or the other of the two power sources to said comparing means in accordance with said control signal from said means for branching.

3. The wave-shaping circuit according to claim 1, wherein said reference signal generating means comprises a power source and a mixer which adds said control signal from said holding means to an output signal from said power-source.

4. The wave-shaping circuit according to claim 1, wherein said comparing means comprises first and second comparators; and said reference signal generating means comprises a first power source connected to said first comparator and a second power source which has a lower voltage level than the voltage level of the first power source and is connected to said second comparator, and a switch which is connected to said first and second comparators and selectively supplies an output signal from one or the other of said first and second comparators to said holding means in accordance with said control signal.

5. A wave-shaping circuit which comprises:
an input terminal for receipt of a coded signal;
means for comparing a signal supplied through said input terminal with a reference signal;
means for holding an output signal from said comparing means for a period of time which is related to the duration of and delayed with respect to said output signal of said comparing means;
means for generating said reference signal, the level of said reference signal being variable in response to a control signal between high and low levels, said means for generating including first and second power sources and a switch which is connected to said first and second power sources to selectively connect one or the other of said two power sources to said means for comparing as said reference signal;
means for branching part of an output signal from said holding means and supplying this branched output signal to said reference signal generating means as said control signal to selectively connect one or the other of said two power sources to said comparing means in accordance with the contents of said output signal from said holding means, wherein said reference signal generating means sets forth a reference signal having said high level in response to said coded input signal to said comparing means having a higher level than said low level of said reference signal and said signal generating means issues a reference signal having said low level in response to said coded input signal to said comparing means having a lower level than said high level of said reference signal.

6. A wave-shaping circuit which comprises:
an input terminal for receipt of a coded signal;
means for comparing said coded signal supplied through said input terminal with first and second reference signals, said comparing means including first and second comparators coupled to receive said first and second reference signals;
means for generating said first and second reference signals, including a first power source connected to said first comparator and a second power source which has a lower voltage level than the voltage level of said first power source connected to said second comparator;
a switch connected to said first and second comparators to selectively supply an output signal from one or the other of said comparators;
means, connected to the output of said switch, for holding said output signal from said comparing means for a period of time which is related to the duration of and delayed with respect to said output signal of said comparing means; and
means for branching part of an output signal from said holding means and supplying this branched output signal as a control signal to selectively control operation of said switch and thereby selectively supply said output signal from said first comparator when said branched output signal in said holding means indicates that said coded input signal was greater than said second reference signal and from said second comparator when said output signal in said holding means indicates that said coded input signal was less than said first reference signal.

* * * * *